(12) United States Patent
Liu

(10) Patent No.: US 8,741,708 B2
(45) Date of Patent: Jun. 3, 2014

(54) TRANSISTOR AND METHOD FOR FORMING THE SAME

(71) Applicant: Semiconductor Manufacturing International Corp., Shanghai (CN)

(72) Inventor: Leo Liu, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/770,283

(22) Filed: Feb. 19, 2013

(65) Prior Publication Data
US 2013/0214329 A1    Aug. 22, 2013

(30) Foreign Application Priority Data

Feb. 21, 2012 (CN) .......................... 2012 1 0039634

(51) Int. Cl.
*H01L 21/336* (2006.01)

(52) U.S. Cl.
USPC ........................................ 438/197

(58) Field of Classification Search
CPC ............. H01L 29/161; H01L 2924/10271; H01L 29/0653; H01L 29/0649
USPC .......................................... 257/411; 438/197
See application file for complete search history.

(56) References Cited

U.S. PATENT DOCUMENTS

| 7,485,518 B2 | 2/2009 | Chan et al. | |
| 8,105,890 B2* | 1/2012 | Sparks | ......................... 438/197 |
| 2012/0094456 A1* | 4/2012 | Wang et al. | ................... 438/285 |
| 2013/0193490 A1* | 8/2013 | Yin et al. | ...................... 257/255 |

* cited by examiner

*Primary Examiner* — Yu-Hsi D Sun
(74) *Attorney, Agent, or Firm* — Anova Law Group, PLLC

(57) ABSTRACT

A transistor and a method for forming the transistor are provided. The transistor can be formed over a substrate including a first region and second regions on opposite sides of the first region. On the substrate, a first SiGe layer can be formed, followed by forming a first silicon layer on the first SiGe layer and forming a second SiGe layer on the first silicon layer. The second SiGe layer and the first silicon layer within the second regions are removed. The first silicon layer within the first region is removed to form a cavity such that the second SiGe layer is floated. An isolating layer is formed in the cavity. Second silicon layers are formed in the second regions. A gate structure is formed on the second SiGe layer within the first region and the second silicon layers are doped to form a source and a drain.

15 Claims, 5 Drawing Sheets

TRANSISTOR AND METHOD FOR FORMING THE SAME

CROSS REFERENCE TO RELATED APPLICATIONS

This application claims priority to Chinese patent application No. 201210039634.9, filed on Feb. 21, 2012, and entitled "METHOD FOR FORMING TRANSISTOR", the entire disclosure of which is incorporated herein by reference.

FIELD OF THE DISCLOSURE

The present disclosure generally relates to the field of semiconductor manufacturing and, more particularly, to a transistor and a method for forming the transistor.

BACKGROUND OF THE DISCLOSURE

With continuous development of semiconductor technology, semiconductor devices are desired to have high device density with high degree of integration in order to obtain a high operation speed, large data storage and more functions. Gate lengths of transistors are thus becoming narrower and shorter than ever. As a result, short channel effect is more likely to occur.

Currently, there are several solutions for suppressing the short channel effect. One of the solutions is to increase the resistance between the source and drain by forming lightly doped regions in the source and drain or using a semiconductor on insulator (SOI) substrate. Another solution is to reduce carrier mobility in the channel region between the source and the drain, by overly doping ions with opposite conductivity type into channel regions, pocket regions and/or halo regions.

SiGe on insulator (SGOI) substrate is a typical SOI substrate. A SGOI substrate may include a strained SiGe layer on an insulation layer. The SiGe layer of the substrate often provides high carrier mobility and low contact capacitance. For this reason, when the SGOI substrate is used as a substrate to form transistors, the short channel effect may be suppressed and transistor performance may be improved.

However, SGOI wafers are generally expensive due to complexity of their formation processes. Further, transistors formed on SGOI substrates are difficult to be integrated with semiconductor devices formed on silicon substrates.

Therefore, there is a need to provide a transistor and a method for forming the transistor with suppressed short channel effect.

SUMMARY

The present disclosure provides a transistor and a method for forming the transistor using a silicon substrate and with suppressed short channel effect.

According to various embodiments, there is provided a method for forming a transistor. The transistor can be formed by providing a substrate including a first region and a plurality of second regions on opposite sides of the first region. A first SiGe layer can be formed on the substrate. A first silicon layer can be formed on the first SiGe layer. A second SiGe layer can be formed on the first silicon layer. A hard mask layer can be formed on the second SiGe layer to expose the second SiGe layer within the plurality of second regions. The second SiGe layer and the first silicon layer within the plurality of second regions can be removed. The first silicon layer between the first SiGe layer and the second SiGe layer within the first region can be removed. An isolating layer can then be formed between the first SiGe layer and the second SiGe layer within the first region. The hard mask layer can be removed. A second silicon layer can be formed within each of the plurality of second regions. The second silicon layer can have a top surface leveling with a top surface of the second SiGe layer. A gate structure can then be formed on the second SiGe layer within the first region.

According to various embodiments, there is provided a transistor. The transistor can be formed over a substrate including a first region and a plurality of second regions on opposite sides of the first region. A first SiGe layer can be formed on the substrate. A first silicon layer can be formed on the first SiGe layer. A second SiGe layer can be formed on the first silicon layer. A hard mask layer can be formed on the second SiGe layer to expose the second SiGe layer within the plurality of second regions. The second SiGe layer and the first silicon layer within the plurality of second regions can be removed. The first silicon layer between the first SiGe layer and the second SiGe layer within the first region can be removed. An isolating layer can then be formed between the first SiGe layer and the second SiGe layer within the first region. The hard mask layer can be removed. A second silicon layer can be formed within each of the plurality of second regions. The second silicon layer can have a top surface leveling with a top surface of the second SiGe layer. A gate structure can then be formed on the second SiGe layer within the first region.

Other aspects or embodiments of the present disclosure can be understood by those skilled in the art in light of the description, the claims, and the drawings of the present disclosure.

DETAILED DESCRIPTION OF THE DISCLOSURE

Figure 1:
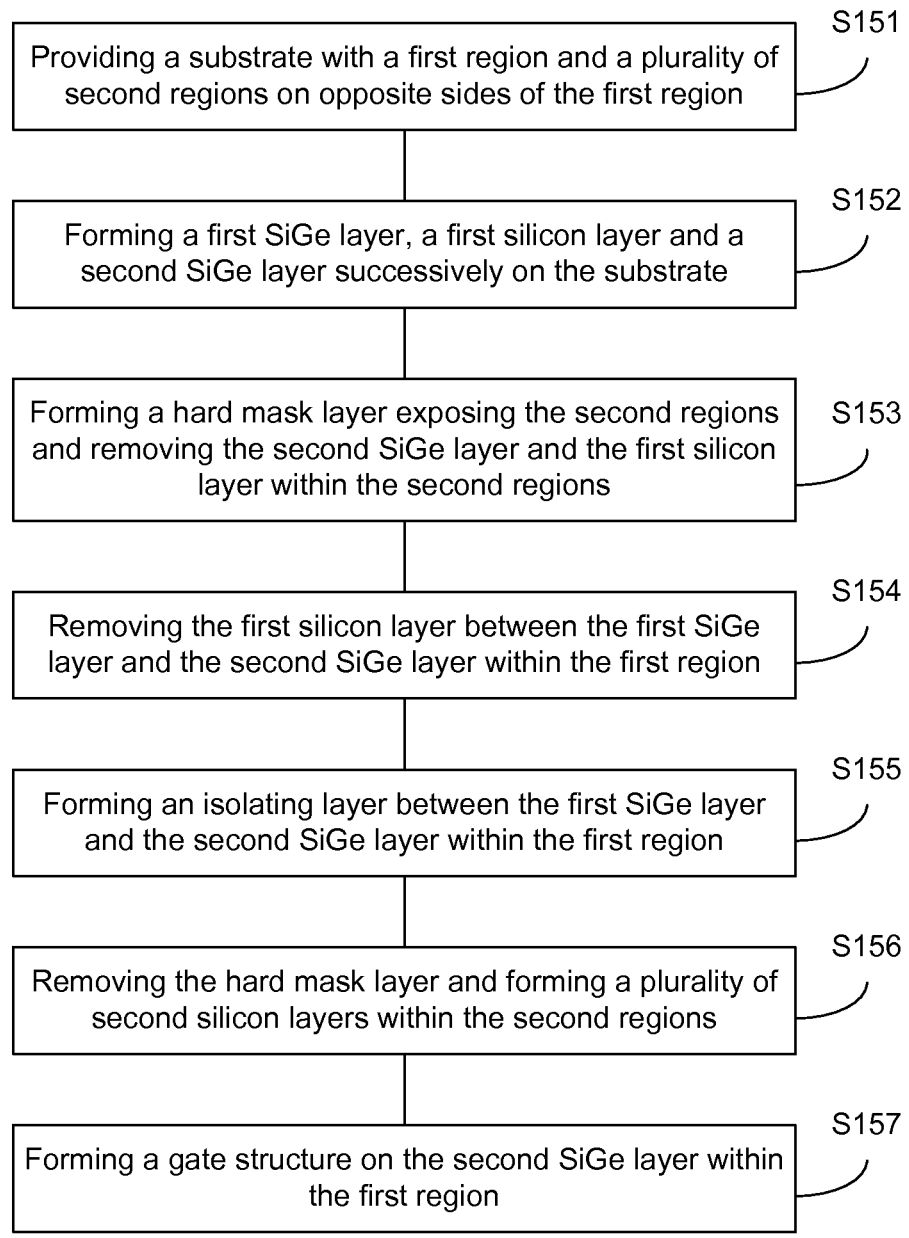
FIG. 1 is a flow chart of an exemplary method for forming a transistor in accordance with various disclosed embodiments.

Reference will now be made in detail to exemplary embodiments of the disclosure, which are illustrated in the accompanying drawings. Wherever possible, the same reference numbers will be used throughout the drawings to refer to the same or like parts. For illustration purposes, elements illustrated in the accompanying drawings are not drawn to scale, which are not intended to limit the scope of the present disclosure. In practical operations, each element in the drawings has specific dimensions such as a length, a width, and a depth.

Transistors may be formed on SGOI substrates in order to suppress short channel effect and reduce the leakage current. However, SGOI substrates are expensive, and challenges arise when integrating devices formed on SGOI substrates with devices formed on silicon substrates. Disclosed herein is a method for forming a transistor on a silicon substrate with suppressed short channel effect.

Figure 2:
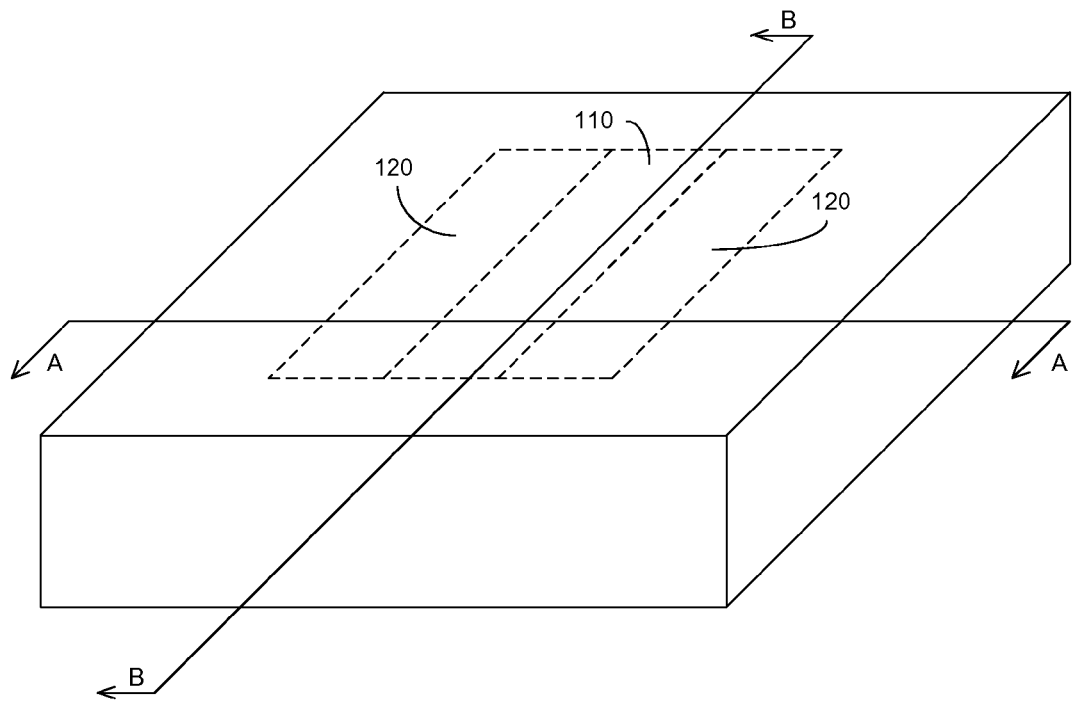
FIG. 2 is a perspective view of a substrate used for forming a transistor in accordance with various disclosed embodiments.

FIG. 1 is a flow chart of an exemplary method for forming an exemplary transistor in accordance with various disclosed embodiments. The exemplary method depicted in FIG. 1 will be illustrated in detail with reference to the accompanying drawings, including, e.g., FIGS. 2-9. Specifically, FIG. 2 depicts a perspective view of a substrate used for forming the exemplary transistor. FIGS. 3-8 are cross-sectional views of intermediate structures along an A-A direction illustrated in FIG. 2 at various stages during formation of the exemplary transistor. FIG. 9 is a cross-sectional view along a B-B direction illustrated in FIG. 2 corresponding to the structure shown in FIG. 5.

In Step S151 of FIG. 1 and referring to FIG. 2, a substrate 100 is provided. As shown in FIG. 2, the substrate 100 includes a first region 110 and a plurality of second regions 120 on opposite sides of the first region 110.

The substrate 100 is a silicon substrate. The silicon substrate is less expensive compared with other substrates such as SGOI. Devices formed on the silicon substrate can be easily integrated with other devices formed on other silicon substrates.

Figure 3:
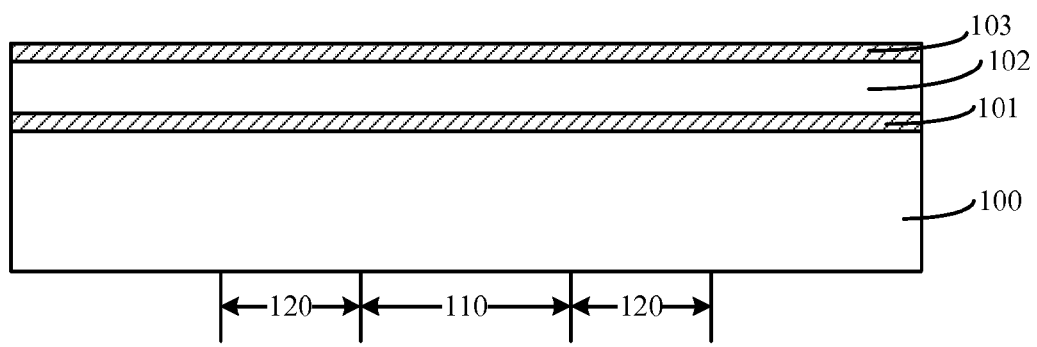
FIGS. 3-8 are cross-sectional views of intermediate structures along an A-A direction illustrated in FIG. 2 at various stages during formation of the exemplary transistor in accordance with various disclosed embodiments.

In Step S152 of FIG. 1 and referring to FIG. 3, a first SiGe layer 101, a first silicon layer 102, and a second SiGe layer 103 are sequentially formed on the substrate 100.

In one embodiment, the first SiGe layer 101 including, e.g., crystalline SiGe, the first silicon layer 102 including, e.g., crystalline Si, and the second SiGe layer 103 including, e.g., crystalline SiGe, are respectively formed by chemical vapor deposition (CVD) processes. That is, a layer including silicon is formed between two SiGe layers. Subsequently, a cavity can be formed between two SiGe layers by removing a portion of the silicon layer. As shown in FIG. 3, the second SiGe layer 103 in the first region 110 can be used as a channel region of the transistor to be formed to increase the transistor's drive current. The first silicon layer 102 in the first region 110 is to be removed to form a cavity, so that the second SiGe layer 103 in the first region 110 is floated, thereby suppressing the short channel effect.

Optionally, the first SiGe layer 101 may have a thickness ranging from about 1 nm to about 200 nm; the first silicon layer 102 may have a thickness ranging from about 1 nm to about 200 nm; and the second SiGe layer 103 may have a thickness ranging from about 1 nm to about 200 nm.

It should be noted that, if the doping concentration of germanium in the SiGe layers is higher, a larger etching selectivity may be obtained when etching the first silicon layer in the first region. However, Ge and Si have different crystalline structures. When the SiGe layers include more Ge than Si, i.e., when the Ge doping concentration in the $Ge_xSi_{1-x}$ layers is greater than 50%, it may be difficult to grow SiGe layers on silicon. Therefore, in a specific embodiment, the doping concentration of germanium in the $Ge_xSi_{1-x}$ layers, e.g., in each of the first SiGe layer and the second SiGe layer, is controlled within a range from about 1% to about 50%.

Figure 4:
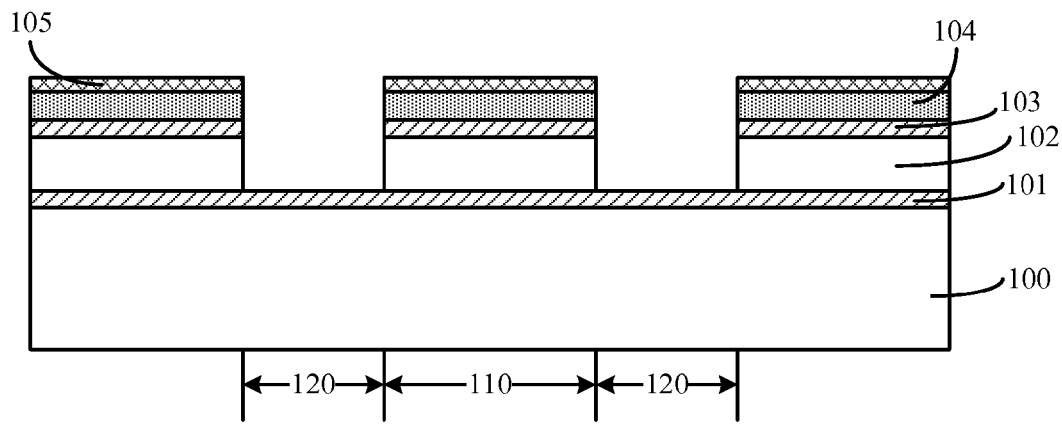

In Step S153 of FIG. 1 and referring to FIG. 4, a hard mask layer 104 exposing the second regions 120 is formed, and then the second SiGe layer 103 and the first silicon layer 102 are partially removed using the hard mask layer 104 as an etch mask.

The hard mask layer 104 may be formed by a lithographic process using a photoresist layer. For example, a hard mask film may be formed, e.g., by CVD, covering the entire surface in FIG. 3. A photoresist layer may then be formed on the hard mask film, e.g., by a spin-on process. A patterned photoresist layer 105 may then be formed after exposure and development processes of the photoresist layer on the hard mask film.

The pattern in the patterned photoresist layer 105 is then transferred to the hard mask film to form the hard mask layer 104 as shown in FIG. 4.

The hard mask layer 104 may be a single-layer structure including silicon oxide or silicon nitride. Alternatively, the hard mask layer 104 may be a multi-layer stacked structure including one or more of silicon oxide and silicon nitride. In a subsequent process for removing a portion of the first silicon layer 102 within the first region 110, the hard mask layer 104 can protect the second SiGe layer 103 within the first region 110.

The second SiGe layer 102 and the first silicon layer 102 exposed by the hard mask layer 104 may be removed using a dry etching process or a wet etching process. The dry etching may be anisotropic and may provide precise profile of the etched structure. The wet etching may provide high etching efficiency and allow for complete etching.

Figure 5:
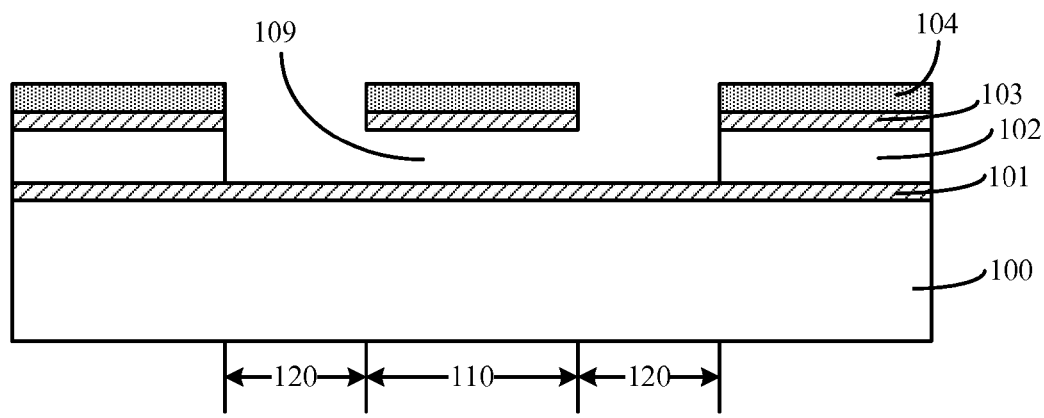

In Step S154 of FIG. 1 and referring to FIG. 5, the first silicon layer 102 (e.g., shown in FIG. 4) within the first region 110 and disposed between the first SiGe layer 101 and the second SiGe layer 103 is removed to form a cavity 109. As shown in FIG. 5, the patterned photoresist layer 105 (shown in FIG. 4) may also be removed to expose the hard mask layer 104.

FIG. 9 depicts a cross-sectional view corresponding to the structure shown in FIG. 5 and along a B-B direction of the substrate shown in FIG. 2. As shown, the second SiGe layer 103 is supported by remaining portions of the first silicon layer 102. The second SiGe layer 103 within the first region 110 is thus floated over the first SiGe layer 101 due to existence of the cavity 109. Therefore, a floated SiGe structure is formed.

Removing the first silicon layer 102 within the first region 110 may be performed by using a wet etching process which may achieve a thorough removal. An alkali based chemical solution may be utilized as an etchant in the wet etching. The alkali based chemical solution may include KOH, $NH_4OH$, tetramethylammonium hydroxide (TMAH), ethylenediamine pyrocatechol (EDP), or any combinations thereof. The etching selectivity of the first silicon layer 102 over the first SiGe layer 101 (or the second SiGe layer 103) is larger than 20, so that the first SiGe layer 101 and the second SiGe layer 103 may substantially maintain desired structure when etching the first silicon layer 102.

Figure 6:
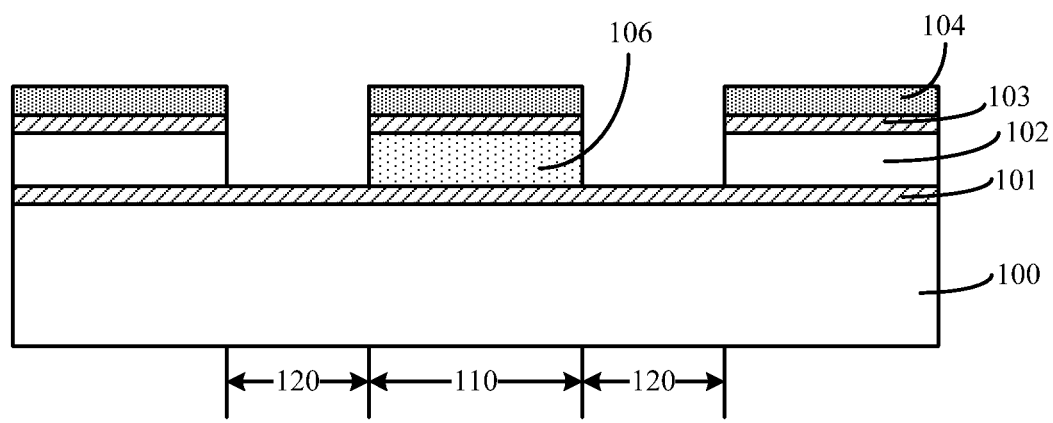

In Step S155 of FIG. 1 and referring to FIG. 6, an isolating layer 106 is formed within the first region 110, between the first SiGe layer 101 and the second SiGe layer 103. The isolating layer 106 may include, e.g., any insulating material (s) or air.

In one example, the isolating layer 106 includes air. That means, after forming the floated SiGe structure as shown in FIG. 5, the isolating layer is already formed because the cavity 109 is already filled up with air. In this case, the process is simplified.

In another example, the isolating layer 106 includes one or more insulating materials, such as silicon oxide, silicon nitride, and/or aluminum oxide. In this case, a substantial SiGe-on-insulator structure is formed having SiGe layers 101 and 103 on the isolating layer 106. Compared with using air in the cavity 109, using insulating materials may provide more stable insulation. In addition, when insulating material (s) are used for the isolating layer 106, the second SiGe layer 103 can be supported by the insulating material(s).

In an exemplary embodiment, the isolating layer 106 includes at least one insulating material. The isolating layer 106 can be formed by: filling an insulating material between the first SiGe layer 101 and the second SiGe layer 103; and etching the filled insulating material within the second regions 120 using the hard mask layer 104 as a mask to remove portions of the filled insulating material until the first SiGe layer 101 is exposed. In various embodiments, the insulating material may be filled into the cavity 109 by a deposition process or a coating process.

The floated SiGe structure (e.g., as shown in FIGS. 5 and 9) or the substantial SiGe-on-insulator structure (e.g., as shown in FIG. 6) formed herein can suppress the short channel effect in the channel region, i.e., in the second SiGe layer 103 within the first region 110, of the to-be-formed transistor. Therefore, the resulting transistor's leakage current may be reduced, and efficiency and electric performance may be improved.

Figure 7:
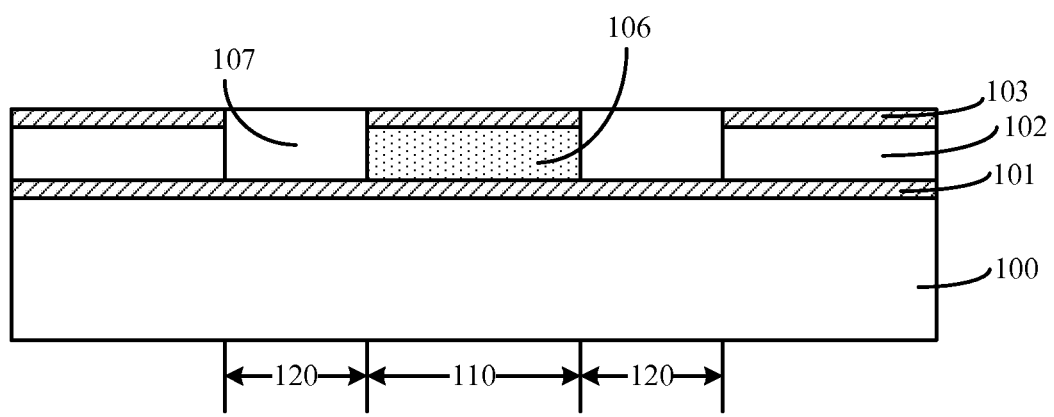

In Step S156 of FIG. 1 and referring to FIG. 7, the hard mask layer 104 (shown in FIG. 6) is removed, e.g., by a wet etching and/or dry etching. A plurality of second silicon layers 107 are formed on the first silicon layer 101 in the second regions 120. A top surface of the second silicon layers 107 may be leveled (or flushed) with a top surface of the second SiGe layer 103.

The second silicon layers 107 on the first SiGe layer 101 within the second regions 120 may be formed by, e.g., a selecting epitaxial deposition process. An exemplary selecting epitaxial deposition process may utilize $SiH_4$, HCl, and $H_2$ as reactants at a processing temperature ranging from about 500° C. to about 800° C., having a chamber pressure ranging from about 5 torr to about 20 torr, and having a flow rate of $SiH_4$ ranging from about 30 sccm to about 300 sccm; a flow rate of HCl ranging from about 50 sccm to about 200 sccm; and a flow rate of $H_2$ ranging from about 5 sccm to about 50 sccm.

In an embodiment, before the removal of the hard mask layer 104 and the formation of the second silicon layers 107, the first SiGe layer 101 within the second regions 120 may be removed. Thereafter, the second silicon layers may be formed directly on the substrate 100 made of silicon. The lattice of the second silicon layers match with the lattice of the substrate, so that dislocation may be reduced in the second silicon layers.

In embodiments, the first SiGe layer 101 within the second regions 120 may be removed by wet etching or dry etching, using the hard mask layer as an etch mask. The dry etching may be anisotropic and may provide precise profile of the etched structure. The wet etching may provide high etching efficiency and allow for complete etching.

Figure 8:
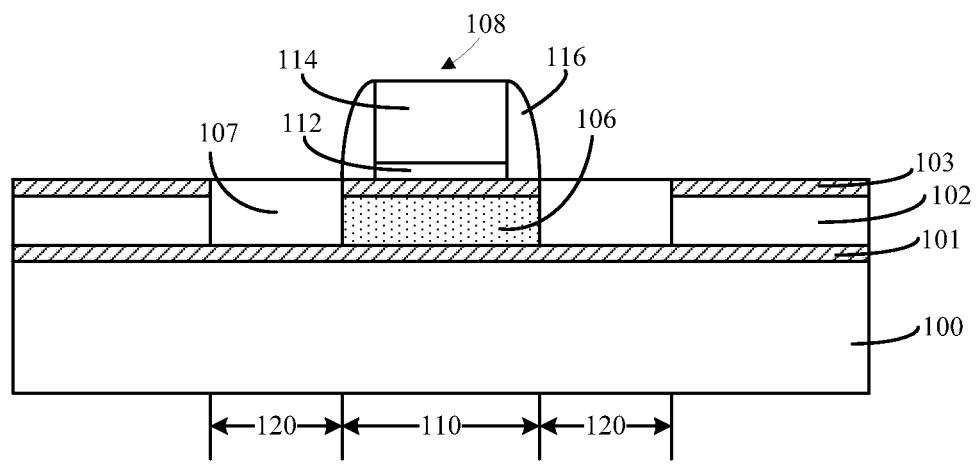
Figure 9:
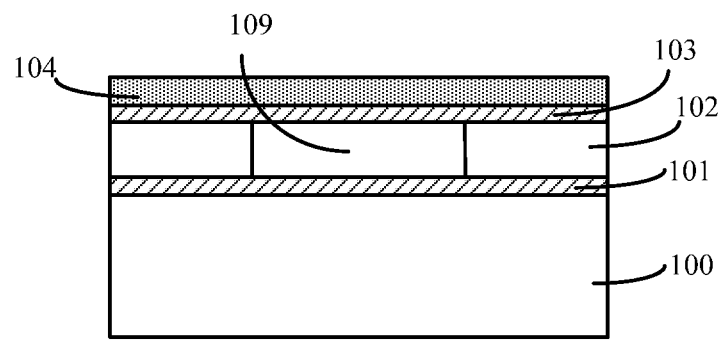
FIG. 9 is a cross-sectional view along a B-B direction shown in FIG. 2 corresponding to the structure shown in FIG. 5 in accordance with various disclosed embodiments.

In Step S157 of FIG. 1 and referring to FIG. 8, a gate structure 108 is formed on the second SiGe layer 103 within the first region 110.

The gate structure 108 includes a gate dielectric layer 112 on the second SiGe layer 103 within the first region 110, a gate electrode 114 on the gate dielectric layer and spacers 116 on opposite sidewalls of the gate dielectric layer and the gate electrode 114.

After the formation of the gate structure 108, an ion doping process may be performed to the second silicon layers 107 within the second regions 120, using the gate structure 108 as a mask. The doped second silicon layers 107 respectively become a source and a drain of a transistor to complete formation of the transistor.

As disclosed, transistors can be formed by a simple process without using expensive SGOI substrates. Processing cost may be reduced. Instead, a floated SiGe structure or a substantial SGOI structure can be formed over a silicon substrate for suppressing short channel effect of the formed transistors. Leakage current may be reduced to provide improved work efficiency and electric performance. In addition, other devices formed on silicon substrates may be easily integrated with the transistor due to use of a silicon substrate.

In an embodiment, before forming the second silicon layers, the first SiGe layer within the second regions is removed to expose the silicon substrate. Thereafter, the second silicon layers are formed directly on the substrate within the second regions, which may improve the crystalline quality of the second silicon layers.

In addition, if the doping concentration of germanium in the SiGe layers is high enough, desired etching selectivity may be obtained when etching the first silicon layer in the first region. However, if the Ge doping concentration is higher than 50%, the SiGe layers are difficult to be grown on silicon layers. In an exemplary embodiment, the doping concentration of germanium in each of the first SiGe layer and the second SiGe layer is controlled ranging from about 1% to about 50% of the total SiGe layer.

The embodiments disclosed herein are exemplary only. Other applications, advantages, alternations, modifications, or equivalents to the disclosed embodiments are obvious to those skilled in the art and are intended to be included within the scope of the present disclosure.

What is claimed is:

1. A method for forming a transistor, comprising:
providing a substrate, wherein the substrate comprises a first region and a plurality of second regions on opposite sides of the first region;
forming a first SiGe layer on the substrate;
forming a first silicon layer on the first SiGe layer;
forming a second SiGe layer on the first silicon layer;
forming a hard mask layer on the second SiGe layer, the hard mask layer exposing the second SiGe layer within the plurality of second regions;
removing the second SiGe layer and the first silicon layer within the plurality of second regions;
removing the first silicon layer between the first SiGe layer and the second SiGe layer within the first region;
forming an isolating layer between the first SiGe layer and the second SiGe layer within the first region;
removing the hard mask layer;
forming a second silicon layer within each of the plurality of second regions, wherein the second silicon layer has a top surface leveling with a top surface of the second SiGe layer; and
forming a gate structure on the second SiGe layer within the first region.

2. The method according to claim 1, wherein the isolating layer comprises air.

3. The method according to claim 1, wherein the isolating layer comprises at least one insulating material.

4. The method according to claim 3, wherein the insulating material comprises one or more of silicon oxide, silicon nitride, and alumina oxide.

5. The method according to claim 1, further comprising:
removing the first SiGe layer within the second regions to expose the substrate, before forming the second silicon layer within each of the plurality of second regions.

6. The method according to claim 1, wherein each of the first SiGe layer, the first silicon layer, and the second SiGe layer is formed by a chemical vapor deposition (CVD).

7. The method according to claim 1, wherein each of the first SiGe layer, the first silicon layer, and the second SiGe layer has a thickness ranging from about 1 nm to about 200 nm.

8. The method according to claim 1, wherein each of the first SiGe layer and the second SiGe layer has a doping concentration of germanium ranging from about 1% to about 50%.

9. The method according to claim 1, wherein the hard mask layer is a single-layer structure including silicon oxide or silicon nitride.

10. The method according to claim 1, wherein the hard mask layer is a multi-layer stacked structure including one or more of silicon oxide and silicon nitride.

11. The method according to claim 1, wherein the first silicon layer between the first SiGe layer and the second SiGe layer within the first region is removed by a wet etching.

12. The method according to claim 11, wherein the wet etching has an etching selectivity of the first silicon layer over each of the first SiGe layer and the second SiGe layer of greater than 20:1.

13. The method according to claim 11, wherein the wet etching uses an alkali based chemical solution as an etchant.

14. The method according to claim 13, wherein the alkali based chemical solution includes KOH, $NH_4OH$, tetramethylammonium hydroxide, ethylenediamine pyrocatechol, or any combination thereof.

15. The method according to claim 1, wherein the second silicon layer is formed by a selecting epitaxial deposition.

* * * * *